United States Patent [19]

Guterman

[11] Patent Number: 4,752,912
[45] Date of Patent: Jun. 21, 1988

[54] NONVOLATILE ELECTRICALLY ALTERABLE MEMORY AND METHOD

[75] Inventor: Daniel C. Guterman, Fremont, Calif.

[73] Assignee: Xicor, Inc., Milpitas, Calif.

[21] Appl. No.: 757,643

[22] Filed: Jul. 22, 1985

Related U.S. Application Data

[63] Continuation-in-part of Ser. No. 734,478, May 14, 1985, Pat. No. 4,599,706.

[51] Int. Cl.⁴ .............................................. G11C 11/34
[52] U.S. Cl. .................................... 365/185; 357/23.5
[58] Field of Search ................... 365/182, 185, 149; 357/23.5, 45

[56] References Cited

U.S. PATENT DOCUMENTS

| | | | |
|---|---|---|---|
| 4,274,012 | 6/1981 | Simko | 365/189 |
| 4,300,212 | 11/1981 | Simko | 365/185 |
| 4,314,265 | 2/1982 | Simko | 357/23.5 |
| 4,486,769 | 12/1984 | Simko | 357/41 |
| 4,599,706 | 7/1986 | Guterman | 365/185 |

Primary Examiner—Joseph A. Popek
Attorney, Agent, or Firm—Fitch, Even, Tabin & Flannery

[57] ABSTRACT

A compact, floating gate, nonvolatile, electrically alterable memory device is fabricated with three layers of polysilicon. In a nonvolatile memory array, each cell is electrically isolated from other cells to eliminate data disturb conditions in nonaddressed cells of the memory array. The memory cell and array is described as including four electrode layers, one of which being formed as a substrate coupling electrode. The cell is also described as being relatively process intolerant. The first electrode layer above the substrate is used to mask the diffusion or implantation of the substrate coupling electrode and other regions in the substrate to form self-aligned active devices.

15 Claims, 1 Drawing Sheet

NONVOLATILE ELECTRICALLY ALTERABLE MEMORY AND METHOD

This application is a continuation-in-part of U.S. patent application Ser. No. 734,478, filed May 14, 1985 for a Nonvolatile Electrically Alterable Memory, now U.S. Pat. No. 4,599,706.

FIELD OF INVENTION

The present invention relates generally to integrated circuit programmable nonvolatile memory devices, and more particularly to an improved nonvolatile memory cell which is tolerant to variations in fabrication process and mask alignment, and a method for constructing such devices.

BACKGROUND OF THE INVENTION

In the prior art, integrated circuit memory devices have been developed which store data for indefinite periods of time in the absence of electrical power being applied thereto and which also have the capability of selectively changing or programming the data stored therein. Of particular interest herein is a nonvolatile memory cell which utilizes a floating gate as the nonvolatile element. See e.g., U.S. Pat. No. 4,314,265 which discloses a four polysilicon layer, floating gate nonvolatile memory cell, and U.S. Pat. No. 4,274,012 which discloses a three polysilicon layer, floating gate nonvolatile memory cell with substrate coupling. Either of these nonvolatile memory cells may be arranged, as is known in the art, to construct nonvolatile random access memories (NOVRAM's) and electrically erasable programmable read only memories (EEPROM's). See, e.g., U.S. Pat. No. 4,300,212, which discloses a NOVRAM device and U.S. Pat. No. 4,486,769, which discloses an EEPROM device. Of course, the principles of the present invention are applicable to other devices utilizing floating gate technology.

In U.S. Pat. No. 4,274,012, for example, the disclosed nonvolatile memory cell has three layers of polysilicon, each layer being generally electrically isolated from the substrate and each other. The first polysilicon layer is a programming electrode. The second polysilicon layer is the floating gate. The floating gate has a portion capacitively coupled to the programming electrode to form a programming tunneling region in which electrons tunnel from the programming electrode to the floating gate. Another portion of the floating gate is capacitively coupled to a n-implant region in the p-type substrate. The n-implant region is a bias electrode. The third polysilicon layer, which is an erase/store electrode, is capacitively coupled to a portion of the floating gate to form an erase tunneling region in which electrons tunnel from the floating gate to the erase/store electrode. Another portion of the erase/store electrode is capacitively coupled to the bias electrode in the substrate.

To initiate tunneling, a high potential, such as 25 v, is applied to the erase/store electrode while the programming electrode is held at a low potential, such as ground. The substrate bias electrode is caused to be held either at the low potential of the programming electrode or held at the high potential of the erase/store electrode, depending on whether electrons are to be tunneled from or to the floating gate, respectively. With the bias electrode held at the high potential, the floating gate being strongly capacitively coupled to the bias electrode is elevated to the high potential. Therefore, high potential exists across the programming tunneling region between the programming electrode and the floating gate so that electrons are tunneled onto the floating gate. Conversely, with the bias electrode held at the low potential, the floating gate will also be at the low potential because of the strong capacitive coupling to the bias electrode. Therefore, high potential exists across the erase tunneling region between the floating gate and the erase/store electrode. Electrons will then tunnel from the floating gate to the erase/store electrode.

The potential of the bias electrode is controlled by a transistor switch, wherein the bias electrode forms the source of the transistor. The low potential is applied to the drain of the transistor. When the transistor is turned on, the bias electrode will be electrically coupled to the low potential. When the transistor is off, the potential of the bias electrode is allowed to float. Due to the strong capacitive coupling between the erase/store electrode and the bias electrode, the high potential applied to the erase/store electrode will be capacitively coupled to the bias electrode. The bias electrode will then be elevated to the high potential.

It is desirable to increase the number of memory devices which are fabricated from a single wafer to increase the chip yield per wafer and thereby to reduce the cost of each chip. In this regard, the size of each memory cell within the memory device must be reduced. However, such reductions in size do not allow a simple miniaturization of existing memory cells. For example, tolerances between mask levels may be difficult to maintain or the miniaturized design may require minimum channel widths not compatible with existing technology. Miniaturization of the above-described nonvolatile memory cell does not allow the necessary capacitive values and relationships to be maintained for an operational memory device. For example, each of the third semiconductor layer and the second semiconductor layer overlay a portion of the substrate and the immediate lower order semiconductor layer. It is the overlap between layers which establishes the magnitude of capacitive coupling. Also, the capacitive coupling required between the erase/store electrode and the bias electrode significantly affects device operation speeds.

It is also desirable to make as many of the steps of the process forming the memory cell relatively insensitive to critical tolerances, in particular to lithographic variations of dimensional control and layer to layer registration. A cell having many self-aligned features provides a significant benefit with respect to process tolerance.

SUMMARY OF THE INVENTION

It is a primary object of the present invention to provide a nonvolatile memory device which is process tolerant by virtue of self alignment between layers.

It is another object of the present invention to reduce the surface area of the cell by improved vertical integration of the nonvolatile cell.

According to the present invention, the nonvolatile floating gate device includes a first polysilicon layer, which functions as a programming electrode, and a second polysilicon layer which functions as the floating gate. A first portion of the floating gate is capacitively coupled to the programming electrode. A second portion of the floating gate is capacitively coupled to a first substrate region disposed in the substrate. The first substrate region is of opposite conductivity type from the substrate. A third polysilicon layer, which functions as the erase/store electrode, is disposed above the floating gate and is capacitively coupled thereto. By having the third semiconductor layer overlapping the floating gate, and not providing any other function relative to the substrate, the capacitance determined by the dielectric spacing and overlap area is not affected by mismatches in alignment. Furthermore, a select transistor has a gate which is formed during the first deposition of polysilicon. This gate is used as a mask for forming the source and drain of the transistor. Therefore, the gate of the transistor becomes self aligned with its source and drain. Thus, the only polysilicon layers in the cell where alignment therebetween remains critical are the first and second polysilicon layers. That is, the floating gate must sufficiently overlap the programming electrode for proper cell function.

These and other objects, advantages and features of the present invention will become more apparent from the following description when read in conjunction with the drawings and the appended claims.

DESCRIPTION OF THE PREFERRED EMBODIMENT

Referring now to FIGS. 1-4, there is shown a nonvolatile memory cell 10 constructed according to the present invention. The memory cell 10 includes a substrate 12 of a first conductivity type, a first electrically isolated semiconductor layer 14, a second electrically isolated semiconductor layer 16 and a third electrically isolated semiconductor layer 18.

Figures 1, 4:
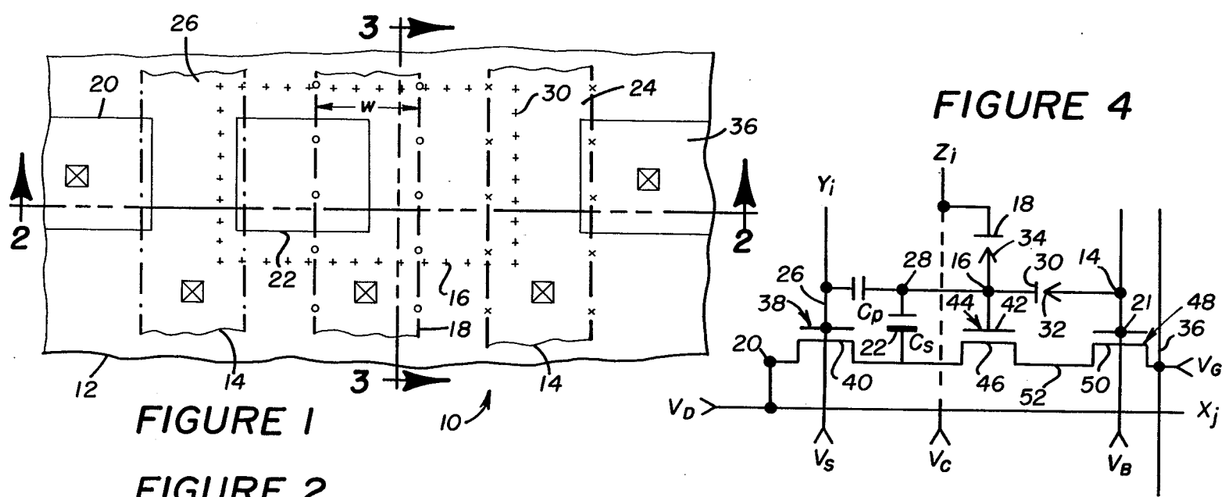
FIG. 1 is a plan view of the memory cell constructed according to the principles of the present invention.
FIG. 4 is an equivalent electrical circuit of the memory cell of FIG. 1.
Figure 2:
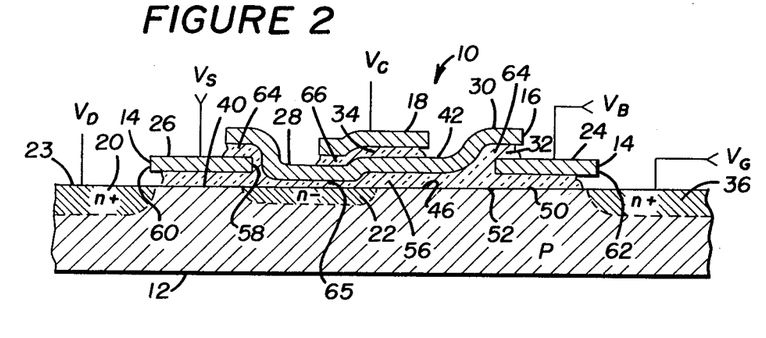
FIG. 2 is a cross-sectional view taken along line 2—2 of FIG. 1.
Figure 3:
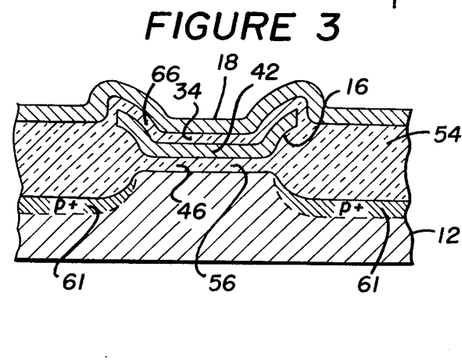
FIG. 3 is a cross-sectional view taken along 3—3 of FIG. 1.

The substrate 12 includes a first substrate region 20, a second substrate region 22, and a surface 23. Each substrate region 20 and 22 is disposed in the surface 23 and is of a second conductivity type opposite the first conductivity type of the substrate 12.

The first semiconductor layer 14 has a first portion 24 and a second portion 26 electrically isolated from the first portion 24. The second portion 26 extends between the first substrate region 20 and the second substrate region 22.

The second semiconductor layer 16 has a first portion 28 capacitively coupled to the second substrate region 22 and a second portion 30 capacitively coupled to the first portion 24 of the first semiconductor layer 14. The capacitive coupling between the first portion 28 of the second semiconductor layer 16 and the second substrate region 22 is best seen in FIG. 4 as capacitance $C_s$. The capacitive coupling between the second portion 30 of the second semiconductor layer 16 and the first portion 24 of the first semiconductor layer 14 is best seen in FIG. 4 as a first tunneling region 32.

The third semiconductor layer 18 is capacitively coupled to the second layer 16. The capacitive coupling of the third semiconductor layer 18 to the second semiconductor layer 16 is best seen in FIG. 4 as a second tunneling region 34.

The substrate 12 further includes a third substrate region 36 of the second conductivity type. The first portion 24 of the first semiconductor layer 14 and the third substrate region 36 extend generally parallel with each other. The first portion 24 of the first semiconductor layer 14 and the third substrate region 36 are common to each cell 10 of the memory array described hereinbelow. The parallel relationship between these elements simplifies the fabrication process and operation of the array as well as satisfying the electrical relationships between the first portion 24 of the first semiconductor layer 14 and the third substrate region 36, as described herein.

As best seen in FIG. 4, the second portion 26 of the first semiconductor layer 14 forms the gate of an enhancement mode cell select transistor 38, having a channel 40 disposed between first substrate region 20 and second substrate region 22. These latter substrate regions 20, 22 form the drain and source of the cell select transistor 38, respectively. A third portion 42 of the second semiconductor layer 16 forms the gate of an insulated gate transistor 44, also referred to herein as the floating gate transistor 44. The floating gate transistor 44 is an enhancement mode transistor in the present embodiment but could also be a depletion mode as well if performance adjustments are made. The second substrate region 22 forms the drain of the floating gate transistor 44. The third portion 42 of the second semiconductor layer 16 overlays a channel 46 of the floating gate transistor 44. The first portion 24 of the first semiconductor layer 14 forms the gate of a enhancement mode isolation transistor 48. The isolation transistor 48 could also be a depletion mode transistor as well if performance adjustments are made. The third substrate region 36 forms the source of the isolation transistor 48. The first portion 24 of the first semiconductor layer 14 overlies a channel 50 of the isolation transistor 48. The floating gate and isolation transistors 44 and 48 are connected to each other by a region 52 between the channel 46 of the floating gate transistor 44 and the channel 50 of the isolation transistor 48. The region 52 can be best described as a virtual junction. The floating gate transistor 44 and the isolation transistor 48 are equivalent to a single enhancement (or depletion, if so used) mode transistor having two adjacent gates, wherein the third portion 42 of the second semiconductor layer 16 forms one gate and the first portion 24 of the first semiconductor layer 14 forms a second gate adjacent the first gate thereof.

Referring now to FIGS. 2 and 3, to construct the nonvolatile memory cell as hereinabove described, an oxide layer is grown on the substrate 12. A field oxide layer 54 is selectively formed in the field regions. In the active region of the memory cell 10 the oxide is formed to a reduced thickness to form a gate oxide 56. The first polysilicon layer 14 is deposited on the device and selectively etched. After etching, what remains in each memory cell 10 is the first portion 24 of the first semiconductor layer 14 and the second portion 26 of the first semiconductor layer 14 as formed on the gate oxide 56. The gate oxide 56 is next selectively etched by utilizing the second portion 26 of the first semiconductor layer as a self-aligning mask on one side, and the thick field oxide layers 54 on the lateral sides, to form a first opening in the gate oxide layer 56 adjacent a first edge 58 of the second portion 26 of the first semiconductor layer 14. The opening in the gate oxide layer 56 exposes a portion of the surface 23 of the substrate 12. By conventional means, such as diffusion or ion implementation, the second substrate region 22 is formed in the surface 23, shown as n−, through the opening in the gate oxide 56.

The most significant alignment tolerance occurs at this step, since the boundary between the second substrate region 22 and the floating gate transistor channel 46 is now formed and is not self-aligned. Consequently, this step requires adequate alignment tolerance to insure proper memory cell operating margins. Even here, self-aligned approaches are possible. Substrate 12 may also include conventional channel stop regions 61, shown as p+ in FIG. 3, to define the lateral edges of the channels 40, 46 and 50 of the cell select transistor 38, the floating gate transistor 44 and the isolation transistor 48, respectively. Alternate field isolation approaches are equally applicable.

As is conventional in the art, gate oxide 56 can be selectively etched to expose another portion of the surface 23 of substrate 12 for forming substrate region 20, using edge 60 of first semiconductor layer 14. Substrate region 20 may alternatively be formed, depending on the thickness of oxide 56, by doping region 20 through oxide 56 without etching but still using edge 60. It is a feature of the present invention to utilize the second portion 26 of the first polysilicon layer 14 as a mask for the formation of the first and second substrate regions 20 and 22 so that the gate of the cell select transistor 38 is self-aligned with the drain and source thereof.

In addition, the gate of isolation transistor 48 is self-aligned with the third substrate region 36. The gate oxide 56 is selectively etched to form a third opening communicating with the surface 23 of substrate 12 along a first edge 62 of the first portion 24 of the first semiconductor layer 14. Of course, the third substrate region 36 may be formed by diffusion or ion implantation, shown as n+ in FIG. 2. The first substrate region 20 can be doped n+ simultaneously.

After the second substrate region is formed, a second oxide layer 64 and a third oxide layer 65 are simultaneously formed over the first semiconductor layer 14 and over the second substrate region 22, respectively. By having the oxide layer 65 thinner than the other oxides surrounding the second semiconductor layer 16 (e.g., the gate oxide 56 and the second oxide 64), the capacitance, $C_s$, between the first portion 28 of the second semiconductor layer 16 and second substrate region 22 can be made significantly larger, thereby providing better floating gate read margins after write. Differential growth rates of oxides in regions 64 and 65 can be readily established in a conventional manner, e.g., oxide grows much faster on polysilicon than on single crystal silicon. Oxide 64 needs to be thick enough to inhibit tunneling from second semiconductor layer 16 to the second portion 26 of first semiconductor layer 14. More importantly, oxide 65 needs to be as thin as possible to maximize $C_s$.

On top of these oxide layers 56, 64 and 65 are deposited the second polysilicon layer 16. The second polysilicon layer 16 is then selectively etched so that the first portion 30 thereof overlies the first portion 24 of the first semiconductor layer 14, the second polysilicon layer 16 extending through the active region of the memory cell 10 so that it also extends to the first edge 58 of the second portion 26 of the first semiconductor layer 14 and overlaps the second oxide layer 64. The overlap between the second semiconductor layer 16 and the second portion 26 of the first semiconductor layer 14 forms a parasitic capacitance, $C_p$.

Thus, after etching, the second polysilicon layer 16 forms the gate of the floating gate transistor 44 of the memory cell 10, and is bounded by the second substrate region 22 and the virtual junction region 52. Furthermore, the floating gate transistor 44 is self-aligned to the first portion 24 of th first semiconductor layer 14. A further oxide layer 66 is then formed on the device to electrically isolate the floating gate formed by the second polysilicon layer 16. On top of the further oxide layer 66 is deposited the third semiconductor layer 18. The third semiconductor layer 18 is selectively etched so that it overlaps the floating gate as best seen in FIG. 3. By controlling the width, w, of the third semiconductor layer 18 during the etching process, its overlap with the floating gate is maintained constant from cell to cell, maintaining tolerance to misalignment for the formation of the second tunneling region 34.

Thus, it is seen how the construction of the memory cell 10 of the present invention is tolerant to most of the processing steps to insure consistency in the relationships between each of the semiconductor layers 14, 16 and 18 so that proper capacitance values are maintained for the first and second tunneling regions 32 and 34.

The mechanism for tunneling of electrons across the first and second tunneling regions 32 and 34 is well known in the art. For example, U.S. Pat. No. 4,274,012 (the '012 patent) describes such tunneling through the oxide layers which separate the polysilicon layers. The requirements for the thickness of the oxide layers between the semiconductor layers 14, 16 and 18 are described in the '012 patent. Therefore, the portions of the '012 patent which describe the tunneling of electrons through the oxide layer, as well as the requirements for the thickness of the oxide separating the semiconductor layers and the capacitive relationships necessary to enable tunneling and which are not inconsistent with the disclosure of the present invention, are incorporated herein by reference.

Having described above the construction of the nonvolatile memory cell 10, described below is the operation of the nonvolatile memory cell 10.

A bias potential $V_B$ is applied to first portion 24 of the first semiconductor layer 14 and a reference potential $V_G$ is applied to third substrate region 36. First portion 24 of the first semiconductor layer 14 forms the gate of the isolation transistor 48. Third substrate region 36 forms the source of the isolation transistor 48. For high voltage power considerations during the write operation, the bias potential $V_B$ and reference potential $V_G$ are selected so that no current is developed in either direction in channel 50 of isolation transistor 48. Channel 50 extends from the virtual junction 52 (equivalent to the electrical connection between the drain of the isolation transistor 48 and source of the floating gate transistor 44) to the third substrate region 36. Accordingly, the gate voltage, $V_B$, of isolation transistor 48 is normally biased sufficiently negative with respect to its source 36 and drain 52 in a preferred embodiment of the present invention during tunneling, so that the isolation transistor 48 remains in a "cutoff" condition irrespective of the drain voltage at virtual junction 52.

A data potential $V_D$ is applied to the first substrate region 20 whose level represents the data state to be stored on second semiconductor layer 16. For example, the first binary state may be represented by a low potential and the other binary state may be represented by a high potential. Concurrently with applying the data potential $V_D$ to the first substrate region 20, a cell select potential $V_S$ is applied to the second portion 26 of the first semiconductor layer 14 of the selected memory cell. The cell select potential $V_S$ is selected to invert the conductivity of channel 40 sufficiently to conduct the full data potential $V_D$ applied to first substrate region 20 to second substrate region 22 through the turned on cell select transistor 38. Also concurrently, a control potential $V_C$ is applied to the third semiconductor layer 18. The control potential $V_C$ and the data potential $V_D$, when $V_D$ is in a high data potential state, are selected to ensure that sufficient potential difference exists across the first tunneling region 32 so that electrons tunnel to the second semiconductor layer 16 from the first portion 24 of the first semiconductor layer 14. With the control potential $V_C$ set at the potential level just described, the data potential $V_D$, when $V_D$ is in a low data potential state, is selected so that sufficient potential difference exists across the second tunneling region 34 so that electrons may tunnel from the second semiconductor layer 16 to the third semiconductor layer 18. The second semiconductor layer 16 forms the floating gate of the nonvolatile memory cell 10 and is hereinafter also referred to as the floating gate 16.

For example, when the data potential $V_D$ applied to the first substrate region 20 is high and a sufficiently high cell select potential $V_S$ is applied to the second portion 26 of the first semiconductor layer 18, the data potential $V_D$ is coupled to second substrate region 22, causing the second substrate region 22 also to attain the high $V_D$ potential. Furthermore, with a sufficiently high control potential $V_C$ applied to the third semiconductor layer 18, little potential difference will exist between the third semiconductor layer 18 and the second substrate region 22. The floating gate 16 will also attempt to reach a high potential because of the capacitive coupling of the dominant capacitor $C_s$ and the capacitive effects of the second tunneling region 34, the parasitic capacitance, $C_p$, and the channel 46 of the floating gate transistor 44. As the potential of the floating gate 16 goes high, little potential difference will exist across the second tunneling region 34 and a large potential difference will then exist across the first tunneling region 32. Consequently, electrons will tunnel from the first portion 24 of the first semiconductor layer 14 to the floating gate 16.

Conversely, when the data voltage $V_D$ is low, potential of the second substrate region 22 is also low. The capacitance $C_s$ between the first portion 28 of the floating gate 16 and the second substrate region 22 as well as the capacitive effects of the first tunneling element 32 and the channel 46 of the floating gate transistor 44 will attempt to capacitively hold the floating gate 16 low upon application of the control potential $V_H$ to the third semiconductor layer 18. Therefore, the potential difference across the first tunneling region 32 is small and the potential difference across the second tunneling region 34 is large. As a result, electrons will tunnel from the floating gate 16 to the third semiconductor layer 18.

An advantage of the present invention over the memory cell disclosed in U.S. Pat. No. 4,274,012 is that the n- implant region of the second substrate region 22 may be considerably smaller than the bias electrode shown in that patent. Additionally, in contrast to the NOVRAM device described in U.S. Pat. No. 4,300,212, no capacitive coupling is required between the third semiconductor layer 18 and a bias electrode in the substrate. In the NOVRAM device, it was this capacitive coupling which let the bias electrode float to the potential of the control voltage to bias the floating gate. Since such capacitive coupling is not required in the present invention, the third semiconductor layer may be made smaller since no dimensions necessary for the capacitive tolerances need be maintained. Described below is the advantage of the present invention over the prior art in terms of eliminating data disturb problems in EEPROM memory cells that are not being written to.

In digital systems, binary state voltage levels are usually 0 volts and +5 volts. It is desirable that the integrated circuit memory device utilizing nonvolatile memory cell 10 of the present invention is operable from these voltages. A charge pump may be included in the integrated circuit memory device to obtain a high potential in the range 25-35 volts from an externally applied 5 volt source. Such a charge pump is described in U.S. Pat. No. 4,326,134. The portions of this patent describing the control of the charge pump and switching of the high potential to the nonvolatile memory cell are incorporated herein by reference. Of course, it is within the ordinary skill of the art to provide a data voltage $V_D$ substantially equal to control voltage $V_H$ when the incoming binary data has one data state and to provide a $V_D$ of zero volts when the incoming binary data has the other binary state.

In the nonvolatile memory cell 10, the state of the floating gate 16 is sensed by applying a potential to the first portion 24 of the first semiconductor layer 14 sufficient to invert the conductivity type of the channel 50 of the isolation transistor 48, so that the potential of the third substrate region 36 is coupled to the channel 46 of the floating gate transistor 44. A second cell select potential is applied to the second portion 26 of the first semiconductor layer 14 along cell select potential line $V_S$ also sufficient to invert the conductivity type of the channel 40 of the cell select transistor 38 to couple the second substrate region 22 to the first substrate region 20. By applying a sense potential to the first substrate region 20, the sense potential will develop a sense current of value dependent on the conduction of the floating gate transistor 44, which represents one binary state. If the floating gate is sufficiently programmed, i.e. with enough negative potential, the conductivity type of the channel 46 of the floating gate transistor 44 will not be inverted, therefore leaving the floating gate transistor 44 off, whereby no current is enabled between the first substrate region 20 and the third substrate region 36. However, if floating gate 16 is erased, i.e. it contains a positive potential, conductivity of the channel 46 of the floating gate transistor will be inverted, thereby turning transistor 44 on, whereby a current will be developed between the first substrate region 20 and the third substrate region 36. The state of the sense current represents the two binary states, programmed and erased, respectively.

The nonvolatile memory cell 10 in accordance with the invention can be used to form a memory array such as an electrically alterable read only memory array with the addition of commonly known decoding and buffering systems in such memory devices.

Such a memory array may comprise a plurality of nonvolatile memory cells constructed as described hereinabove with reference to the memory cell 10. The third substrate region 36 is a bulk implant region common to each memory cell 10 as best seen in FIG. 4. The first portion 24 of the first semiconductor layer 14, to which the bias potential $V_B$ is applied, is also common to each cell 10. However, the second portion 26 of the first semiconductor layer, in the preferred embodiment of the present invention, forms a word line $Y_i$ common to a column of the nonvolatile memory cells 10. Also, the third semiconductor layer 18 forms a bias electrode $Z_i$ which runs parallel to and operates in communction with one of each second portion 26 of the first semiconductor layer 14 in each column. When the $Y_i$ line of a given column of cells is biased high, this column's corresponding $Z_i$ line must also be brought to its high potential for a write operation. The unselected Y and corresponding Z columns remain biased low. The first substrate region 20 in each row of the nonvolatile memory cells 10 along a row is connected to a bit line $X_j$. Each substrate region 20 in a row is connected to bit line $X_j$ by a metallization deposited over oxide. Of course, it is within the ordinary skill of the art to provide row and column decoders in a memory array.

The above described array, when configured as an EEPROM device, has several advantages compared to the EEPROM device disclosed in U.S. Pat. No. 4,486,769 in terms of eliminating data disturb problems in unselected memory cells. One such advantage is the elimination of partial tunneling voltages appearing across either of the first tunneling element 32 or the second tunneling element 34 in any unselected cell. Since the cell select transistor 38 is operated in a cutoff condition in all unselected columns and the third semiconductor layer in all unselected columns is biased to a low voltage, no partial voltage can be coupled to the floating gate 16 in such unselected cells by the application of a high data potential $V_D$ along any row data line $X_j$ to the first substrate region 20 of the unselected cell. Furthermore, in contrast to the selection of a single cell, as described in the '769 patent, the device of array selects all cells along a column having a common word line $Y_i$ formed by the second portion 26 of the first semiconductor layer 14. This word select capability of the array eliminates the application of a high voltage to one side of a tunneling element in an unselected cell.

Also, the described embodiment offers the general benefit of allowing a direct write of the data, without the need of performing an unconditional erase before a conditional write operation, which is generally the case in existing EEPROMs. An additional benefit of the described embodiment is the flexibility to set the bias of third semiconductor layer, line $Z_i$, at a discretionary potential since it does not form a transistor in the memory cell read path. In this way, it can be used to provide margin testing of the memory cell floating gate 16, or can be independantly adjusted to optimize memory cell performance.

The present invention has been described utilizing n-channel technology. It is within the ordinary skill of the art to use p-channel technology. In this regard, the potentials described above would be opposite in polarity. It will be appreciated that other variations and modifications to the present invention may be made without departing from the inventive concepts described herein. Accordingly, the present invention is to be limited solely by the scope of the appended claims.

What is claimed is:

1. A nonvolatile floating gate device comprising:
    a substrate of a first conductivity type having a first surface, a first substrate region and a second substrate region, each said substrate region being disposed in said first surface and being of a second conductivity type opposite said first conductivity type;
    first means for selectively applying one of a first data potential and a second data potential to said first substrate region, said first data potential being applied when data to be stores in sais devicw has one binary state, said second data potential being applied when data to be stored in said device has the other binary state;
    a first electrically insulated semiconductor layer spaced from said first surface and having a first portion and a second portion electrically isolated from said first portion, said second portion extending between said first substrate region and said second substrate region;
    second means for applying a first bias potential to said first portion of said first semiconductor layer;
    third means for applying a first coupling potential to said second portion of said first semiconductor layer, said coupling potential being elected to invert the conductivity type of said substrate between each said substrate region to said second conductivity type to electrically couple the potential of said first substrate region to said second substrate region;
    a second electrically insulated semiconductor layer having a first portion capacitively coupled to said second substrate region and a second portion capacitively coupled to said first portion of said first semiconductor layer;
    a third electrically insulated semiconductor layer being capacitively coupled to said second semiconductor layer;
    fourth means for selectively applying a first control potential to said third semiconductor layer,
    said control potential, each said data potential and said bias potential being selected so that electrons are intorduced onto said second semiconductor layer from said first portion of said first semiconductor layer upon applicaiton of said first data potential to said first substrate region for storing said one binary state, and further selected so that electrons are removed from said second semiconductor layer to said third semiconductor layer upon application of said second data potential to said first substrate region for storing said other binary state; and
    means for sensing the potential of said second semiconductor layer.

2. A device as set forth in claim 1 further comprising:
    a third substrate region of said second conductivity type disposed in said first surface;
    fifth means for applying a reference potential to said third substrate region, said reference potential and said bias potential being selected to prevent current flow between said second substrate region and said third substrate region.

3. A device as set forth in claim 1 wherein said sensing means includes:
    a third substrate region of said second conductivity type disposed in said first surface;
    fifth means for applying a reference potential to said third substrate region;
    a third portion of said second semiconductor layer spaced from said first surface, said third portion of said second semiconductor layer and said first portion of said first semiconductor layer being adjacently disposed between said second substrate region and said third substrate region;

said second means further for applying a second bias potential to said first portion of said first semiconductor layer, said second bias potential being selected to invert the conductivity of said substrate adjacent said first portion of said first semiconductor layer to said second conductivity type to electrically couple the potential of one of said second substrate region and said third substrate region to a selected portion of said substrate adjacent said third portion of said second semiconductor layer, the other of said second substrate region and said third substrate region being electrically adjacent said selected portion of said substrate to form a channel region between said other of said second substrate region and said third substrate region and said substrate adjacent said first portion of said first semiconductor layer;

said first means further for applying a sense potential to said first substrate region;

said third means further for applying a second coupling potential to said second portion of said first semiconductor layer, said second coupling potential being selected to invert the conductivity type of said substrate between said first substrate region and second substrate region with a conductivity less then when said first coupling potential is applied for electrically coupling said sense potential applied to said first substrate region to said second substrate region, said sense potential and said reference potential being selected to develop a potential difference across said portion of said substrate adjacent said third portion of said second semiconductor layer, the conductivity of said portion of said substrate being a function of the stored binary state of said second semiconductor layer, said potential difference developing a sense current between said first substrate region and said third substrate region as a function of the conductivity of said portion of said substrate whereby said sense current has a magnitude as a function of said stored binary state; and means for detecting the magnitude of said sense current.

4. A device as set forth in claim 3 wherein said third portion of said second semiconductor layer is disposed intermediate said second substrate region and said first portion of said first semiconductor layer, said first portion of said first semiconductor layer being disposed intermediate said third portion of said second semiconductor layer and said third substrate region.

5. A device as set forth in claim 4 wherein said third portion of said second semiconductor layer forms a first gate of an insulated gate transistor and said first portion of said first semiconductor layer forms a second gate of said transistor adjacent said first gate, said second substrate region forming one of a source and a drain of said transistor, said third substrate region forming the other of said source and said drain.

6. A device as set forth in claim 3 wherein the conductivity of said portion of said substrate adjacent said third portion of said second semiconductor layer is said first type when electrons have been introduced onto said second semiconductor layer, and said conductivity of said portion of said substrate is said second type when electrons have been removed from said second semiconductor layer.

7. A device as set forth in claim 1 wherein said second portion of said first semiconductor layer forms a gate of an insulated gate transistor, said first substrate region forming a source fo said transistor, said second substrate region forming a drain of said transistor.

8. A device as set forth in claim 1, wherein said substrate is p-type monocrystalline silicon.

9. A device as set forth in claim wherein each said semiconductor layer is polysilicon.

10. A nonvolatile floating gate device comprising:
a substrate of a first conductivity type having a first surface;
a first electrically insulated semiconductor layer being spaced from said first surface;
a second electrically insulated semiconductor layer having a first portion and a second portion, said first portion being capacitively coupled to said first semiconductor layer;
a third electrically insulated semiconductor layer being capacitively coupled to said second layer;
a first transistor having a gate, a source, a drain, and a channel, said drain and source formed in said substrate with diffusions having a conductivity type opposite said substrate, the channel of said first transistor disposed between said source and said drain, said second portion of said second semiconductor layer being capacitively coupled to one said source and said drain;
first means for selectively applying one of a first data potential and a second data potential to the other of said source and said drain, said first data potential being applied when data to be stored in said device has one binary state, said second data potential being applied when data to be stored in said device has the other binary state;
second means for applying a first bias potential to said semiconductor layer;
third means for selectively applying a first coupling potential to said gate, said coupling potential being selected to turn said first transistor on;
fourth measn for applying a control potential to said third semiconductor layer, each said potential being selected so that electrons are introduced onto said second layer from said first layer upon application of said first potential to said other of said source and said drain when said transistor is turned on, and further so that electrons are removed from said second layer to said third layer upon application of said second potential to said other of said source and said drain when said transistor is turned on; and
means for sensing the potential of said second layer.

11. A device as set forth in claim 10 wherein said sensing means includes:
a second transistor having a source and a drain, said first semiconductor layer forming a gate of said second transistor;
fifth means for selectively applying a reference potential to one of said source and said drain of said second transistor, said second means further for applying a second bias potential to said first semiconductor layer, said reference potential and said second bias potential being selected to turn said second transistor on, said third means further for applying a second coupling potential to said gate of said first transistor to turn said transistor on with the conductivity less than when said first coupling potential is applied thereto, said first means further for applying a sense potential to said other of said source and said drain of said first transistor;

a floating gate transistor having a gate formed by said second layer, a source and a drain, one of said source and said drain of said floating gate transistor being coupled to said one of said source and said drain of said first transistor, the other of said source and said drain of said floating gate transistor being coupled to the other of said source and said drain of said second transistor, the conductivity of said floating gate transistor being a function of the data state stored by said second layer, said sense potential and said reference potential being selected to develop a sense current between said other of said source and said drain of said first transistor to which said sense potential is applied and said one of said source and said drain of said second transistor to which said reference potential is applied, said sense current having the magnitude as the function of the conductivity of said floating gate transistor; and means for detecting the magnitude of said sense current.

12. A device as set forth in claim 10 wherein said sensing means includes:

a second transistor having a source and a drain, said first semiconductor layer forming a first gate of said transistor, said second layer forming a second gate of said transistor adjacent said first gate;

fifth means for selectively applying a reference potential to one of said source and said drain of said second transistor, the other of said source and said drain of said second transistor being formed by said one of said source and said drain of said first transistor, said second means further for applying a second bias potential to said first semiconductor layer, said reference potential and said second bias potential being selected to invert the conductivity of said substrate adjacent said first gate, said third means further for applying a second coupling potential to said gate of said first transistor to turn said transistor on with a conductivity less than when said first coupling potential is applied thereto, said first means further for applying a sense potential to said other of said source and said drain of said first transistor, the conductivity of said second transistor being a function of the data state stored by said floating gate, said sense potential and said reference potential being selected to develop a sense current between said one of said source and said drain of said first transistor and said one of said source and said drain of said second transistor, said sense current having a magnitude as a function of the conductivity of said second transistor; and means for detecting said magnitude of said sense current.

13. A device as set forth in claim 12 wherein said sense potential is applied to said drain of said first transistor, said source of said first transistor being coupled to said drain of said second transistor, said reference potential being applied to the source of said second transistor.

14. A device as set forth in claim 13 wherein said second transistor is turned on when electrons are removed from said floating gate and is turned off when electrons are introduced onto said floating gate in the presence of said second bias potential and said reference potential being applied to said first gate and said source of said second transistor.

15. An integrated circuit memory device having a plurality of nonvolatile memory cells interconnected into an array having a plurality of rows and a plurality of columns, said device comprising:

a semiconductor substrate of a first conductivity type having a first surface in which said memory cells are disposed, a plurality of first substrate regions, a plurality of second substrate regions and a third substrate region, each of said substrate regions being of a second conductivity type opposite said first conductivity type, one of said first substrate regions being disposed within a portion of each of said memory cells along one of said rows, one of said second substrate regions being disposed within each said memory cell, said third substrate region being disposed within a portion of all said memory cells;

means for selectively applying one of a first data potential representing a first binary state and a second data potential representing a second binary data state to selected ones of said first substrate regions;

a first electrically insulated semiconductor layer spaced from said first surface and having a first portion overlying a portion of each of said cells forming a first channel region in said first surface in each of said cells and a plurality of second portions, each of said second portions defined along one of said columns and forming a second channel region between a respective one of said first substrate regions and said second regions in each of said cells, each said first channel region being adjacent a portion of said third substrate region within the associated one of said cells;

means for applying a bias potential to said first portion of said first semiconductor layer;

means for selectively applying a coupling potential to one of said second portions of said first semiconductor layer such that a selected column of cells has said coupling potential applied thereto, said coupling potential being selected to invert the conductivity type of said second channel region to said second conductivity type in said selected column of cells to electrically couple the potential of said corresponding first substrate regions in each of said cells to said second substrate region in each of said cells;

a plurality of second electrically insulated semiconductor layers, one of said second semiconductor layers being in each said cell and having a first portion capacitively coupled to said first portion of said first semiconductor layer within said cell and a second portion capacitively coupled to said second substrate region in said cell;

a plurality of third electrically insulated semiconductor layers, one of said third layers being disposed in each of said columns and being capacitively coupled to each of said second semiconductor layers in each cell in such column;

means for applying a control potential to the third semiconductor layer corresponding to said selected one of said second portions of said first semiconductor layer such that said selected column of cells has said control potential applied thereto, said control potential, bias potential and coupling potential being selected so that electrons are introduced onto said second semiconductor layer in each of said cells in said selected one of said columns from said first semiconductor layer when said first data potential is applied to said first substrate regions of said cells in said selected one of said columns and so that electrons are removed from said second semiconductor layer to said third semiconductor layers of said cells in said selected one of said columns when said second data potentil is applied to said first substrate regions;

means for applying a reference potential to said third substrate region; and means for selectively sensing the potential of each of said second semiconductor layers.

* * * * *

UNITED STATES PATENT AND TRADEMARK OFFICE
CERTIFICATE OF CORRECTION

PATENT NO. : 4,752,912
DATED : June 21, 1988
INVENTOR(S) : Daniel C. Guterman

It is certified that error appears in the above-identified patent and that said Letters Patent is hereby corrected as shown below:

Column 6, Line 6, after "of" delete "th" and insert therefor --the--.

Column 9, line 6, delete "communication" and insert therefor --conjunction--.

Column 10, line 6, delete "stores in sais devicw" and insert therefor --stored in said device--.

Signed and Sealed this

Eleventh Day of July, 1989

Attest:

DONALD J. QUIGG

*Attesting Officer*  *Commissioner of Patents and Trademarks*